United States Patent
Nakaguchi et al.

(10) Patent No.: US 12,377,802 B2
(45) Date of Patent: Aug. 5, 2025

(54) POWER SUPPLY CONTROL DEVICE, POWER SUPPLY CONTROL METHOD, AND PROGRAM

(71) Applicants: AutoNetworks Technologies, Ltd., Yokkaichi (JP); Sumitomo Wiring Systems, Ltd., Yokkaichi (JP); Sumitomo Electric Industries, Ltd., Osaka (JP)

(72) Inventors: Shinnosuke Nakaguchi, Yokkaichi (JP); Masayuki Kato, Yokkaichi (JP); Kota Oda, Yokkaich (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 49 days.

(21) Appl. No.: 18/570,364

(22) PCT Filed: Jun. 6, 2022

(86) PCT No.: PCT/JP2022/022707
§ 371 (c)(1),
(2) Date: Dec. 14, 2023

(87) PCT Pub. No.: WO2022/270279
PCT Pub. Date: Dec. 29, 2022

(65) Prior Publication Data
US 2024/0278741 A1    Aug. 22, 2024

(30) Foreign Application Priority Data

Jun. 25, 2021    (JP) .................................. 2021-105663

(51) Int. Cl.
*B60R 16/023* (2006.01)
*B60R 16/033* (2006.01)
*H03K 3/017* (2006.01)

(52) U.S. Cl.
CPC ........ *B60R 16/0232* (2013.01); *B60R 16/033* (2013.01); *H03K 3/017* (2013.01)

(58) Field of Classification Search
CPC .... B60R 16/0232; B60R 16/033; H03K 3/017
(Continued)

(56) References Cited

U.S. PATENT DOCUMENTS 11,128,131 B2 * 9/2021 Yoshimura ........... H02H 1/0007
2014/0168840 A1 * 6/2014 Hafner .................... H02H 9/02
361/86

(Continued)

FOREIGN PATENT DOCUMENTS

JP    2013-236297 A    11/2013
WO   2018-147103 A1    8/2018

OTHER PUBLICATIONS

International Search Report, Application No. PCT/JP2022/022707, mailed Aug. 9, 2022. ISA/Japan Patent Office.

*Primary Examiner* — Michael R. Fin
(74) *Attorney, Agent, or Firm* — Honigman LLP

(57) ABSTRACT

A power supply control device includes a first switch, a second switch, and a control unit. The control unit performs a first control of turning the first switch on, and performs, if an abnormality is detected by an abnormality detection unit, on/off control of alternately turning the second switch on and off.

9 Claims, 4 Drawing Sheets

(58) Field of Classification Search
USPC .................................................. 307/9.1, 10.1
See application file for complete search history.

(56) References Cited

U.S. PATENT DOCUMENTS

| | | |
|---|---|---|
| 2016/0301202 A1 | 10/2016 | Tsukamoto et al. |
| 2017/0279443 A1 | 9/2017 | Morimoto |
| 2019/0356161 A1 | 11/2019 | Wakazono et al. |
| 2021/0384757 A1 | 12/2021 | Sawano et al. |

* cited by examiner

POWER SUPPLY CONTROL DEVICE, POWER SUPPLY CONTROL METHOD, AND PROGRAM

CROSS-REFERENCE TO RELATED APPLICATIONS

This application is the U.S. national stage of PCT/JP2022/022707 filed on Jun. 6, 2022, which claims priority of Japanese Patent Application No. JP 2021-105663 filed on Jun. 25, 2021, the contents of which are incorporated herein.

TECHNICAL FIELD

The present disclosure relates to a power supply control device, a power supply control method, and a program.

BACKGROUND

JP 2019-140747A discloses a power supply control device that can suppress an increase in temperature of a semiconductor switch when a half-on failure occurs. The power supply control device disclosed in JP 2019-140747A has a function to determine whether or not a current is flowing in the semiconductor switch when the semiconductor switch is instructed to be turned off.

If a half-on failure occurs in a semiconductor switch, a current will continue to flow through the semiconductor switch even when it is instructed to be turned off. As a countermeasure of this problem, it is conceivable to cause a current to flow through a path that is different from the path through which the semiconductor switch causes a current to flow to a load so as to advance the discharge of a power accumulator, thereby reducing the time in which current flows unexpectedly in the semiconductor switch. However, in this method, it takes time until the current flowing through the semiconductor switch is suppressed.

The present disclosure provides a technique for reducing, when an abnormality occurs in which a switch remains in a conductive state while an OFF signal is given, the effective value of a current flowing through the switch.

SUMMARY

According to a first aspect of the present disclosure, a power supply control device to be installed in a vehicle, comprising: a first switch that is provided between a first conductive path and a second conductive path, and is configured to be switched on in response to an ON signal and to be switched off in response to an OFF signal, a second switch provided between the first conductive path and the second conductive path, in parallel to the first switch an abnormality detection unit configured to detect an abnormality in which the first switch remains in a conductive state while the OFF signal is given to the first switch, and a control unit configured to control the first switch and the second switch, wherein the first switch has an ON-resistance that is smaller than an ON-resistance of the second switch, and the control unit performs a first control of turning the first switch on, and performs, if the abnormality is detected by the abnormality detection unit, on/off control of alternately turning the second switch on and off.

According to a second aspect of the present disclosure, a power supply control method for controlling power supply inside a vehicle using a power supply control device, the power supply control device comprising: a first switch that is provided between a first conductive path and a second conductive path, and is configured to be switched on in response to an ON signal and to be switched off in response to an OFF signal; a second switch provided between the first conductive path and the second conductive path, in parallel to the first switch; an abnormality detection unit configured to detect an abnormality in which the first switch remains in a conductive state while the OFF signal is given to the first switch; and a control unit configured to control the first switch and the second switch, wherein the first switch has an ON-resistance that is smaller than an ON-resistance of the second switch, and the control unit performs a first control of turning the first switch on, and performs, if the abnormality is detected by the abnormality detection unit, on/off control of alternately turning the second switch on and off.

According to a third aspect of the present disclosure, a program for causing a power supply control device installed in a vehicle to execute power supply control, the power supply control device including: a first switch that is provided between a first conductive path and a second conductive path, and is configured to be switched on in response to an ON signal and to be switched off in response to an OFF signal; a second switch provided between the first conductive path and the second conductive path, in parallel to the first switch; an abnormality detection unit configured to detect an abnormality in which the first switch remains in a conductive state while the OFF signal is given to the first switch; and a control unit configured to control the first switch and the second switch, wherein the first switch has an ON-resistance that is smaller than an ON-resistance of the second switch, and the program comprises the steps of: causing the control unit to execute a first control of turning the first switch on; and causing the control unit to execute, if the abnormality is detected by the abnormality detection unit, on/off control of alternately switching the second switch on and off.

Advantageous Effects

The technique according to the present disclosure makes it easy to reduce, when an abnormality occurs in which a switch remains in a conductive state while an OFF signal is given, the effective value of a current flowing through the switch.

DETAILED DESCRIPTION OF PREFERRED EMBODIMENTS

Figure 1:
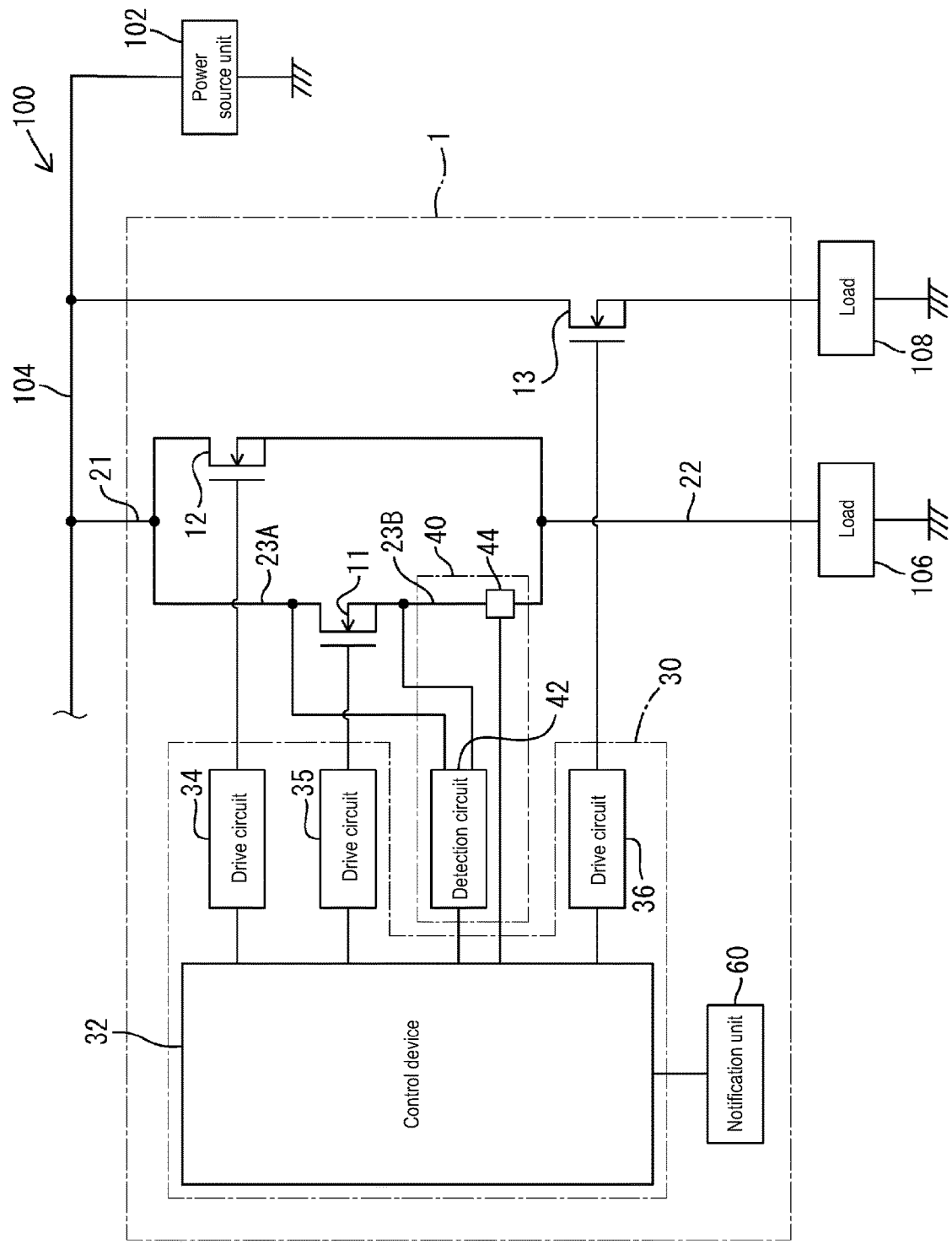
FIG. 1 is a block diagram schematically exemplifying an on-vehicle system that includes a power supply control device according to a first embodiment.

Hereinafter, embodiments of the present disclosure will be listed and described. Note that aspects one through nine exemplified below may be combined in a suitable manner to the extent that they are not inconsistent with each other.

In a first aspect, a power supply control device to be installed in a vehicle, comprising: a first switch that is provided between a first conductive path and a second conductive path, and is configured to be switched on in response to an ON signal and to be switched off in response to an OFF signal; a second switch provided between the first conductive path and the second conductive path, in parallel to the first switch; an abnormality detection unit configured to detect an abnormality in which the first switch remains in a conductive state while the OFF signal is given to the first switch; and a control unit configured to control the first switch and the second switch, wherein the first switch has an ON-resistance that is smaller than an ON-resistance of the second switch, and the control unit performs a first control of turning the first switch on, and performs, if the abnormality is detected by the abnormality detection unit, on/off control of alternately turning the second switch on and off.

The power supply control device according to the first aspect can perform the first control of turning the first switch on, so that a current can flow through the first switch that has a relatively small ON-resistance. Also, if an abnormality is detected by the abnormality detection unit, the power supply control device can perform the on/off control of alternately switching the second switch on and off, so that a current flowing between the first conductive path and the second conductive path can be distributed over the first switch and the second switch. Accordingly, the effective current of the first switch is suppressed, and heat generation resulting from an increase in damages is suppressed.

In a second aspect, a power supply control device has, in the power supply control device according to the first aspect, the following features. The vehicle is configured to be switched between a state in which the vehicle can travel and a state in which the vehicle cannot travel, and the power supply control device further comprises a notification unit configured to notify a passenger within the vehicle of an abnormality when the on/off control of the second switch is performed at least while the vehicle is in the state in which the vehicle can travel.

When performing the on/off control, the power supply control device according to the second aspect can notify a passenger within the vehicle of this fact, and thus the passenger inside the vehicle can recognize and deal with the situation.

In a third aspect, a power supply control device has, in the power supply control device according to the first or the second aspects, the following features. The vehicle is configured to be switched between the state in which the vehicle can travel and the state in which the vehicle cannot travel, and if the vehicle is switched from the state in which the vehicle can travel to the state in which the vehicle cannot travel during the on/off control, the control unit continues the on/off control also after the vehicle has been switched to the state in which the vehicle cannot travel.

The power supply control device according to the third aspect can suppress an excessive current from continuing to flow through the first switch in which the abnormality has occurred, after the vehicle has been switched to the state in which the vehicle cannot travel.

In a fourth aspect, a power supply control device has, in the power supply control device according to the third aspect, the following features. When continuing the on/off control after the vehicle has been switched to the state in which the vehicle cannot travel, the control unit supplies power to a predetermined load from an electric storage unit serving as a power supply source for causing a current to flow through the first switch and the second switch.

If the above-described abnormality is detected, the power supply control device according to the fourth aspect continues the on/off control and supplies power to a predetermined load from an electric storage unit serving as a power supply source for causing a current to flow through the first switch and the second switch, after the vehicle has switched to the state in which the vehicle cannot travel, thus making it possible to not only suppress the current flowing through the first switch, but also reduce the current flow duration by forcibly consuming the power based on an electric storage unit.

In a fifth aspect, a power supply control device has, in the power supply control device according to any one of the first through the fourth aspects, the following features. The power supply control device of [5] further includes a resistance detection unit configured to detect a resistance of the first switch when the first switch is in the conductive state. The control unit outputs a PWM (Pulse Width Modulation) signal, performs the on/off control of turning on/off of the second switch using the PWM signal, and sets a duty cycle of the PWM signal based on the resistance detected by the resistance detection unit.

The power supply control device according to the fifth aspect can perform PWM control according to the actual resistance of the first switch, when performing the on/off control in response to the above-described abnormality.

In a sixth aspect, a power supply control device has, in the power supply control device according to any one of the first through the fifth aspects, the following features. The first switch and the second switch are mounted on a common substrate, the first switch is mounted on one surface of the substrate, and the second switch is mounted on another surface of the substrate.

In the power supply control device according to the sixth aspect, the first switch and the second switch can be arranged on opposite sides at a distance, making it possible to further suppress concentration of heat when the above-described abnormality occurs.

In a seventh aspect, a power supply control device has, in the power supply control device according to any one of the first through the sixth aspects, the following features. The first switch and the second switch are mounted on a common substrate. The first switch is mounted at a position on the substrate near a first end portion on one side in a predetermined direction, and the second switch is mounted at a position on the substrate near a second end portion on a side in the predetermined direction that is opposite to the one side.

In the power supply control device according to the seventh aspect, the first switch and the second switch can be arranged at opposite end portions at a distance, making it possible to further suppress concentration of heat when the above-described abnormality occurs.

In an eighth aspect, a power supply control method for controlling power supply inside a vehicle using a power supply control device, the power supply control device comprising: a first switch that is provided between a first conductive path and a second conductive path, and is configured to be switched on in response to an ON signal and to be switched off in response to an OFF signal; a second switch provided between the first conductive path and the second conductive path, in parallel to the first switch; an abnormality detection unit configured to detect an abnormality in which the first switch remains in a conductive state while the OFF signal is given to the first switch; and a control unit configured to control the first switch and the second switch, wherein the first switch has an ON-resistance that is smaller than an ON-resistance of the second switch, and the control unit performs a first control of turning the first switch on, and performs, if the abnormality is detected by the abnormality detection unit, on/off control of alternately turning the second switch on and off.

The power supply control method according to the eighth aspect has the same effects as those of the power supply control device according to the first aspect.

In a ninth aspect, a program for causing a power supply control device installed in a vehicle to execute power supply control, the power supply control device including: a first switch that is provided between a first conductive path and a second conductive path, and is configured to be switched on in response to an ON signal and to be switched off in response to an OFF signal; a second switch provided between the first conductive path and the second conductive path, in parallel to the first switch; an abnormality detection unit configured to detect an abnormality in which the first switch remains in a conductive state while the OFF signal is given to the first switch; and a control unit configured to control the first switch and the second switch, wherein the first switch has an ON-resistance that is smaller than an ON-resistance of the second switch, and the program comprises the steps of causing the control unit to execute a first control of turning the first switch on; and causing the control unit to execute, if the abnormality is detected by the abnormality detection unit, on/off control of alternately switching the second switch on and off.

The program according to the ninth aspect has the same effects as those of the power supply control device according to the first aspect.

First Embodiment

Overview of On-Vehicle System

Figure 2:
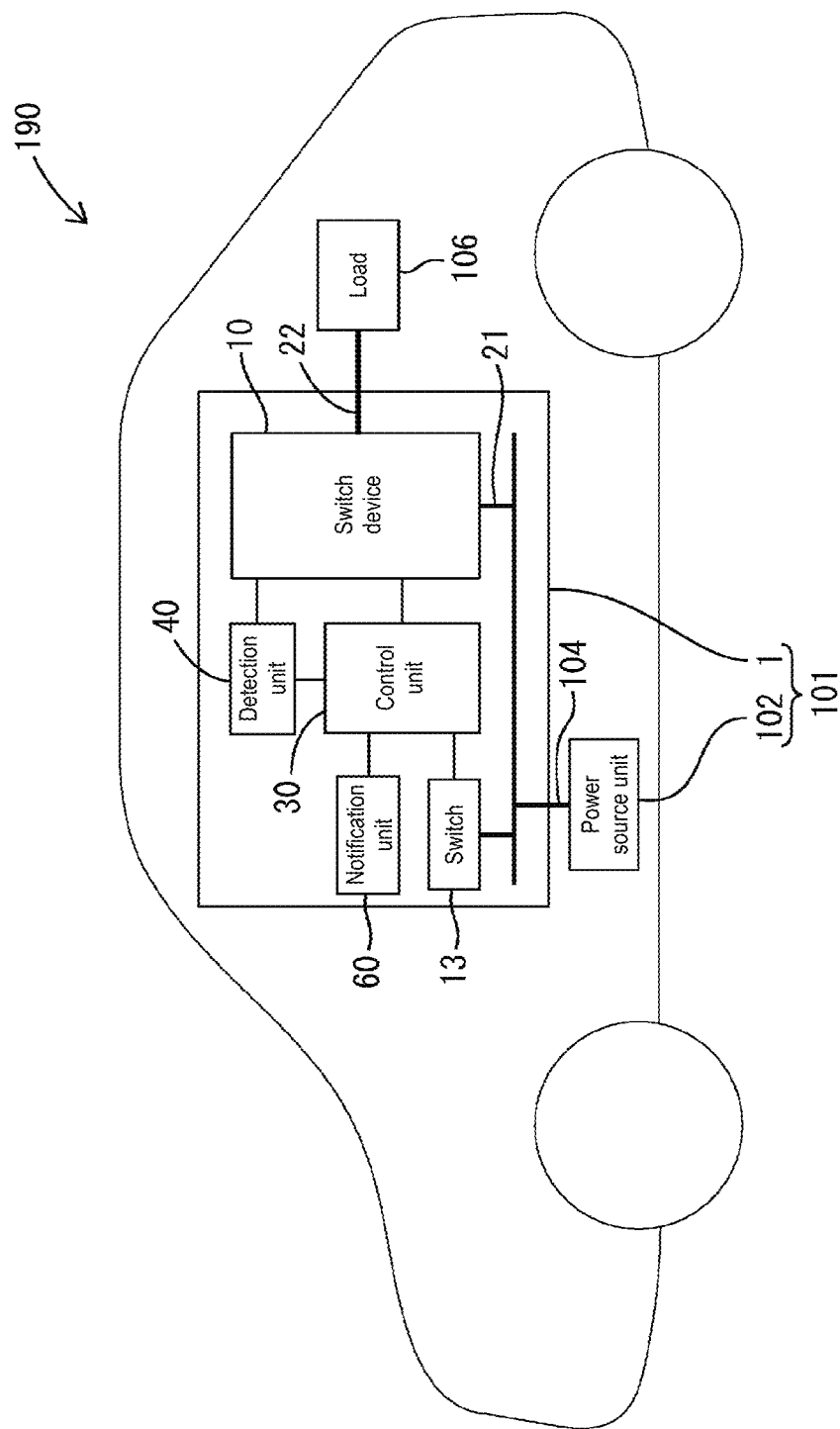
FIG. 2 is a diagram illustrating a schematic example of a vehicle that includes the power supply control device according to the first embodiment.

An on-vehicle system 100 shown in FIG. 1 is a system that can be installed in a vehicle 190, and includes a power source system 101 and a load 106. In addition to the load 106, a power source unit 102, and a power supply control device 1, multiple other components are installed in the vehicle 190. The on-vehicle system 100 is a system that can be installed in the vehicle 190 as shown in FIG. 2. In the on-vehicle system 100, the power source system 101 controls power to be supplied to the load 106.

The load 106 is an electric component that can operate upon being supplied with power. Various components or devices can be used as the load 106. The load 106 exemplified in FIG. 1 has, for example, a resistive component. The load 106 may also include an inductive component or a capacitive component.

The power source system 101 mainly includes the power source unit 102, a power path 104, the power supply control device 1, and the like. The power source system 101 is a system that supplies power to the load 106 based on the power supplied from the power source unit 102.

The power source unit 102 is an electric storage unit that serves as a main power source for supplying power to the load 106. The power source unit 102 is configured as, for example, an on-vehicle battery such as a lead battery. The power source unit 102 has, for example, a terminal on the high-potential side electrically connected to the power path 104, and applies a fixed voltage to the power path 104. The voltage to be applied to the power path 104 by the power source unit 102 is referred to also as +B voltage. Note that the power source unit 102 may include a power circuit. For example, the power source unit 102 may have a configuration in which the power circuit applies a fixed voltage to the power path 104 based on the power from the electric storage unit.

Note that in the present specification, voltage means a voltage relative to the ground, unless otherwise noted.

The power path 104 is electrically connected to the high-potential side terminal of the power source unit 102 directly or via another conductive path, and is configured such that a fixed direct voltage from the power source unit 102 can be applied to it. The power path 104 is a path through which power from the power source unit 102 is transmitted. The power path 104 may include a component such as a fuse and a relay.

Basis Configuration of Power Supply Control Device

The power supply control device 1 is a device that can be installed in the vehicle 190 as shown in FIG. 2 and controls power supply to on-vehicle loads including the load 106 and the like. The power supply control device 1 mainly includes a first switch 11, a second switch 12, a third switch 13, a first conductive path 21, a second conductive path 22, a control unit 30, a detection unit 40, a notification unit 60, and the like.

The first conductive path 21 is a conductive path electrically connected to the power path 104. In the example shown in FIG. 1, the first conductive path 21 is shorted to the power path 104, so that the first conductive path 21 and the power path 104 are at the same predetermined potential (for example, the potential at the high-potential side terminal of the power source unit 102). The first conductive path 21 may be constituted only by a wiring with a conductor, and but may also be provided with a fuse or the like.

The second conductive path 22 is a conductive path serving as a path through which a current flows to the load 106. The second conductive path 22 has the same or substantially the same potential as a terminal of the first switch 11 on the other side and a terminal of the second switch 12 on the other side. The second conductive path 22 is electrically connected to an end of the load 106. The first conductive path 21 may be constituted only by a wiring with a conductor, and may be provided with a fuse or the like.

In the example of FIG. 1, the first switch 11 and the second switch 12 constitute a switch device 10. In the example of FIG. 1, when at least one of the first switch 11 and the second switch 12 is in an ON-state, a current flows from the power source unit 102 toward the load 106. The first switch 11 is provided between the first conductive path 21 and the second conductive path 22. The first switch 11 is switched on in response to an ON signal (for example, a signal at a high-level voltage) given to an input terminal (specifically, the gate terminal) of the first switch 11, and is switched off in response to an OFF signal (for example, a signal at a low-level voltage) given to the input terminal. In the example of FIG. 1, one terminal (specifically, the drain terminal) of the first switch 11 is electrically connected to the first conductive path 21. Another terminal (specifically, the source terminal) of the first switch 11 is electrically connected to the second conductive path 22. In the example of FIG. 1, the one terminal of the first switch 11 is shorted to the first conductive path 21 and the power path 104, and has the same potential as the first conductive path 21 and the power path 104. The ON-resistance of the first switch 11 is smaller than the ON-resistance of the second switch 12.

The second switch 12 is provided between the first conductive path 21 and the second conductive path 22. The second switch 12 is provided parallel to the first switch 11. The second switch 12 is switched on in response to an ON signal (for example, a signal at a high-level voltage) given to an input terminal (specifically, the gate terminal) of the second switch 12, and is switched off in response to an OFF signal (for example, a signal at a low-level voltage) given to the input terminal (specifically, the gate terminal). In the example of FIG. 1, one terminal (specifically, the drain terminal) of the second switch 12 is electrically connected to the first conductive path 21. Another terminal (specifically, the source terminal) of the second switch 12 is electrically connected to the second conductive path 22. In the example of FIG. 1, the one terminal of the second switch 12 is shorted to the first conductive path 21 and the power path 104, and has the same potential as the first conductive path 21 and the power path 104. When both the first switch 11 and the second switch 12 are in a normal state, the ON-resistance of the first switch 11 when an ON signal has been given to the first switch 11 is smaller than the ON-resistance of the second switch 12 when an ON signal has been given to the second switch 12. The normal state of the first switch 11 is a state in which the first switch 11 is turned on when an ON signal has been given to the first switch 11, and the first switch 11 is turned off when an OFF signal has been given to the first switch 11. The normal state of the second switch 12 is a state in which the second switch 12 is turned on when an ON signal has been given to the second switch 12, and the second switch 12 is turned off when an OFF signal has been given to the second switch 12.

The third switch 13 is provided between the power path 104 and the ground. The third switch 13 is switched on in response to an ON signal (for example, a signal at a high-level voltage) given to an input terminal (specifically, the gate terminal) of the third switch 13, and is switched off in response to an OFF signal (for example, a signal at a low-level voltage) given to the input terminal (specifically, the gate terminal). In the example of FIG. 1, one terminal (specifically, the drain terminal) of the third switch 13 is shorted to the power path 104, and has the same potential as the power path 104.

Each of the first switch 11, the second switch 12, and the third switch 13 is constituted by, for example, a semiconductor switch such as a FET (Field Effect Transistor) or an IGBT (Insulated Gate Bipolar Transistor). In the representative example shown in FIG. 1, each of the first switch 11, the second switch 12, and the third switch 13 is constituted by an N-channel FET.

The control unit 30 is a device that can perform various types of control. For example, the control unit 30 controls on/off of the first switch 11, the second switch 12, and the third switch 13. The control unit 30 mainly includes a control device 32 and drive circuits 34, 35, and 36.

The control device 32 is constituted by, for example, a control device such as an MCU (Micro Controller Unit). The control device 32 is a device that can perform various types of information processing and computing. The control device 32 is an example of an abnormality detection unit. The control unit 30 detects an abnormality in which the first switch 11 remains in a conductive state while an OFF signal is given to the first switch 11.

During a period in which a high-level signal is given from the control device 32, the drive circuit 34 gives a high-level signal at a first voltage (ON signal at a voltage that turns on the second switch 12) to the input terminal (specifically, the gate terminal) of the second switch 12. During a period in which a low-level signal is given to the control device 32, the drive circuit 34 gives a low-level signal at a second potential (OFF signal at the voltage that that turns off the second switch 12) that is lower than the first voltage to the input terminal of the second switch 12.

During a period in which a high-level signal is given from the control device 32, the drive circuit 35 gives a high-level signal at a first voltage (ON signal at a voltage that turns on the first switch 11) to the input terminal (specifically, the gate terminal) of the first switch 11. During a period in which a low-level signal is given from the control device 32, the drive circuit 35 gives a low-level signal at a second potential (OFF signal at a voltage that turns off the first switch 11) that is lower than the first voltage to the input terminal of the first switch 11.

During a period in which a high-level signal has been given from the control device 32, the drive circuit 36 gives a high-level signal at a first voltage (ON signal at a voltage that turns on the third switch 13) to the input terminal (specifically, the gate terminal) of the third switch 13. During a period in which a low-level signal has been given from the control device 32, the drive circuit 36 gives a low-level signal at a second potential (OFF signal at a voltage that turns off the third switch 13) that is lower than the first voltage to the input terminal of the third switch 13.

The detection unit 40 includes a detection circuit 42 serving as a voltage detection unit, and a current sensor 44 serving as a current detection unit. The detection circuit 42 can detect the potential of the conductive path 23A between the first switch 11 and the first conductive path 21. Furthermore, the detection circuit 42 can detect the potential of the conductive path 23B between the first switch 11 and the second conductive path 22. The current sensor 44 is a current detection circuit that detects a current flowing through the first switch 11 (specifically, a current flowing through the conductive path 23B). In the representative example of FIG. 1, the detection circuit 42 gives, to the control device 32, an analog voltage value based on which the value of the voltage of the conductive path 23A can be specified (that is, the value of the voltage at one end of the first switch 11). Furthermore, the detection circuit 42 gives, to the control device 32, an analog voltage value based on which the value of the voltage of the conductive path 23B can be specified (that is, the value of the voltage at the other end of the first switch 11). The current sensor 44 gives, to the control device 32, an analog voltage value based on which the value of the current flowing through the first switch 11, and the conductive paths 23A and 23B can be specified.

The third switch 13 functions as a switching unit that is controlled by the control unit 30 and is switched between a state in which power supply to the load 108 is allowed, and a state in which the power supply is stopped. When the third switch 13 is in an ON-state, power supply is performed such that a current based on power from the power source unit 102 flows toward the load 108 via the third switch 13. When the third switch 13 is in an OFF-state, the operation of supplying power to the load 108 via the third switch 13 is stopped. Note that the configuration of supplying power to the load 108 as shown in FIG. 1 is merely an example, and any circuit configuration is possible as long as it is switched between a state (power supply state) in which a current based on the power from the power source unit 102 is fed to the load 108, and a state in which the current supply is stopped (power supply disabling state).

The notification unit 60 includes, for example, a display unit such as a display lamp or an image display device, and an audio output unit such as a speaker or a buzzer. The notification unit 60 can output audio and display information (such as, for example, image information including character information and graphic information). The notification operation of the notification unit 60 is controlled by the control device 32.

Mounting Structure to Substrate

Figure 3:
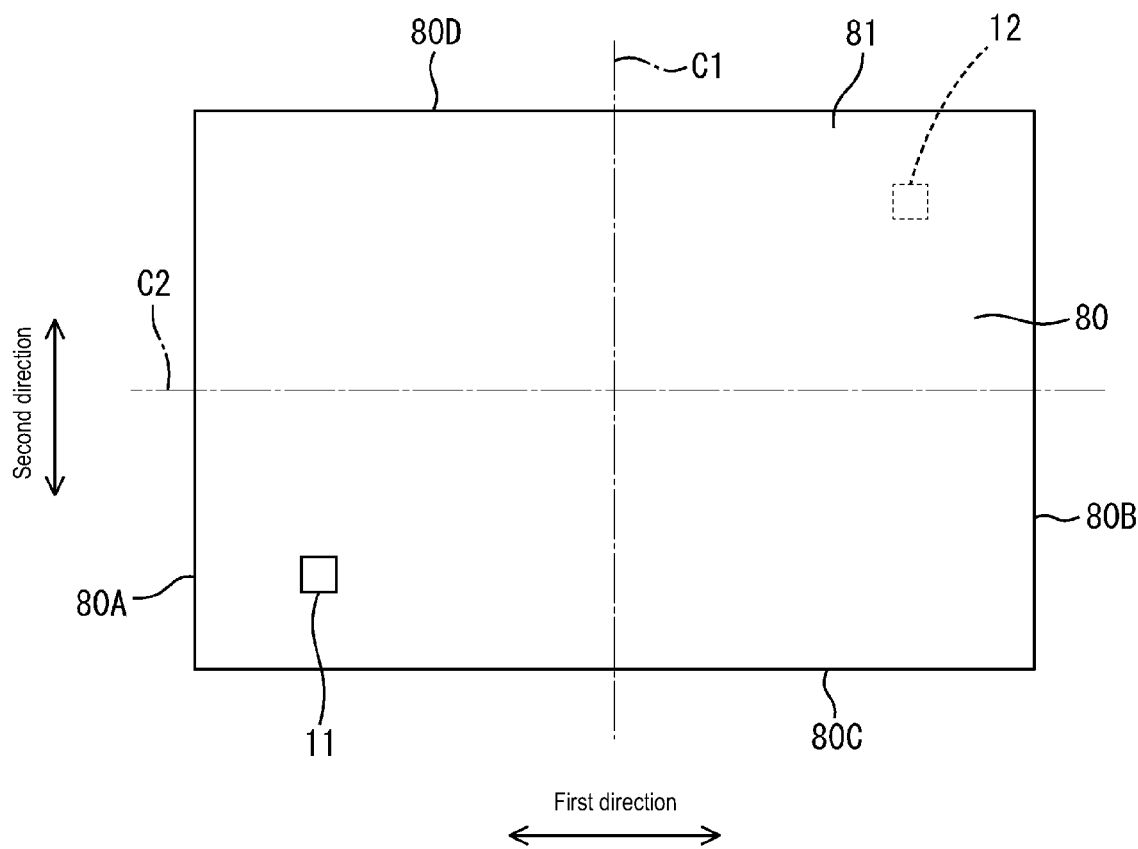
FIG. 3 is a plan view illustrating a simplified mounting structure of the power supply control device of the first embodiment to a substrate.
Figure 4:
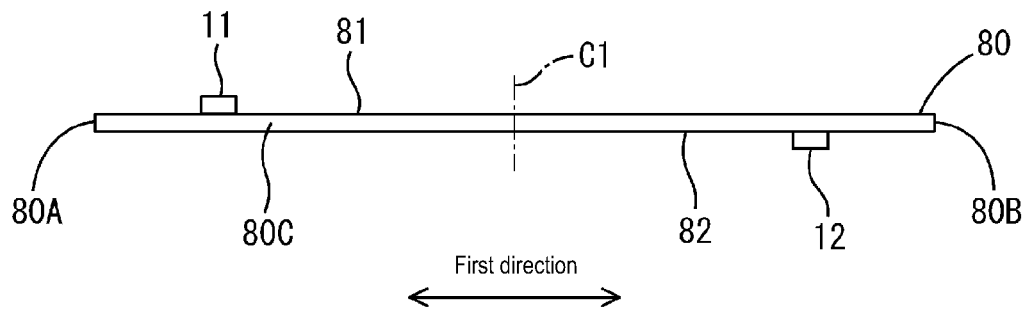
FIG. 4 is a front view illustrating a simplified mounting structure of the power supply control device of the first embodiment to the substrate.

The power supply control device 1 has a configuration in which the various types of components (for example, the first switch 11, the second switch 12, the third switch 13, the first conductive path 21, the second conductive path 22, the control unit 30, and the detection unit 40) shown in FIG. 1 are mounted on a common substrate 80 (see FIGS. 3 and 4). Note that, in FIGS. 3 and 4, illustration of the components other than the first switch 11, the second switch 12, and the substrate 80 is omitted.

Among the components mounted on the substrate 80, the first switch 11 is mounted on one surface 81 of the substrate 80. The second switch 12 is mounted on another surface 82 of the substrate 80. The one surface 81 is a plate surface on one side in a thickness direction of the substrate 80. The other surface 82 is a plate surface on the other side in the thickness direction of the substrate 80. Note that for the components other than the first switch 11 and the second switch 12 on the substrate 80, various layouts can be employed.

In the example shown in FIGS. 3 and 4, the first switch 11 is mounted at a position on the substrate 80 near an end portion 80A on one side in a first direction. The second switch 12 is mounted at a position on the substrate 80 near the end portion 80B on the other side in the first direction (opposite to the one side). The expression "the first switch 11 is mounted at a position . . . near an end portion 80A on one side in a first direction" means that the first switch 11 is mounted in a region of the substrate 80 provided between a central position C1 in the first direction and the end portion 80A. The expression "the second switch 12 is mounted at a position . . . near an end portion 80B on the other side in the first direction" means that the second switch 12 is mounted in a region of the substrate 80 provided between the central position C1 in the first direction and the end portion 80B. The first direction is a predetermined direction that is orthogonal to the thickness direction of the substrate 80. In the example of FIG. 3, the first direction is the longitudinal direction of the plate surface of the substrate 80.

Furthermore, the first switch 11 is mounted at a position on the substrate 80 near the end portion 80C on one side in a second direction. The second switch 12 is mounted at a position on the substrate 80 near the end portion 80D on the other side in the second direction (opposite to the one side). The expression "the first switch 11 is mounted at a position . . . near an end portion 80C on one side in a second direction" means that the first switch 11 is mounted in a region of the substrate 80 between a central position C2 in the second direction and the end portion 80C". The expression "the second switch 12 is mounted at a position . . . near an end portion 80D on the other side in the second direction" means that the second switch 12 is mounted in a region of the substrate 80 between the central position C2 in the second direction and the end portion 80D. The second direction is a direction orthogonal to the thickness direction of the substrate 80 and the first direction. In the example of FIG. 3, the second direction is the short-side direction of the plate surface of the substrate 80.

Power Supply Control

Figure 5:
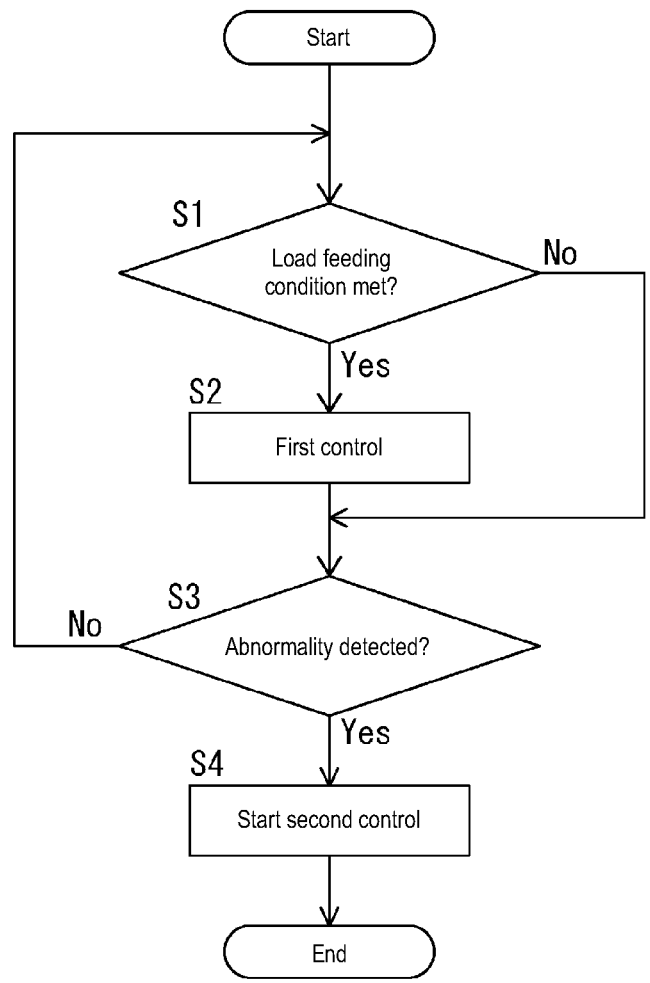
FIG. 5 is a flowchart exemplifying a flow of power supply control that is performed by the power supply control device of the first embodiment.

The following description relates to power supply control that is performed in the power supply control device 1. The power supply control shown in FIG. 5 is executed by a program stored in a storage unit provided inside or outside the control device 32. The control unit 30 (specifically, the control device 32) executes the control shown in FIG. 5 in accordance with this program.

If a predetermined start condition is met in the vehicle 190, the program causes the control unit 30 to perform the control shown in FIG. 5. The expression "a predetermined start condition is met" may mean that, for example, an activation condition for activating the vehicle is met (for example, an activation switch such as an ignition switch is switched from OFF-state to ON-state), may mean that the power supply to the power supply control device 1 is started, or may mean that another condition is met.

At the start of the power supply control shown in FIG. 5 in accordance with the program, the control unit 30 determines in step S1 whether or not the condition (load feeding condition) for supplying power to the load 106 is met, and if it is determined that the load feeding condition is not met, the control unit 30 moves the processing to step S3 while maintaining the initial state (in which both the first switch 11 and the second switch 12 are maintained in the OFF-state).

If it is determined in step S1 that the load feeding condition is met, the control unit 30 starts or continues first control in step S2. The control unit 30 continues the first control if the first control has already been performed at a point in time when step S2 is executed, while the control unit 30 starts the first control if the first control has not been executed at the point in time when step S2 is executed. The first control is a control in which the first switch 11 is turned on, specifically, a control in which the first switch 11 is turned on and the second switch 12 is turned off. The first control may be a control in which the first switch 11 is maintained to be in the ON-state, or a control in which the first switch 11 is turned on/off (for example, control in which the first switch 11 is turned on/off at a set duty cycle).

The control unit 30 determines in step S3 whether or not an abnormality of the first switch 11 has been detected. In this context, "abnormality" means an abnormality in which the first switch 11 remains in a conductive state while an OFF signal is given to the first switch 11. Detection of the "abnormality" may be executed at the time of or before step S3. For example, the control unit 30 may determine that there is the above-described "abnormality" (may detect an abnormality) if the voltage of the conductive path 23B while the above-described initial state is maintained is greater than or equal to a predetermined value. Alternatively, the control unit 30 may set a detection period in which both the first switch 11 and the second switch 12 are turned off in the first control, and may determine that there is the above-described "abnormality" (may detect an abnormality) if the voltage of the conductive path 23B is greater than or equal to the predetermined value during the detection period. The control unit 30 is an example of the abnormality detection unit.

If, in step S3, it is determined that the "abnormality" of the first switch 11 has not been detected, the control unit 30 returns the processing to step S1. If the load feeding condition is met when the processing is returned to step S1, the control unit 30 moves the processing to step S2 and continues the first control. That is, the control unit 30 continues the first control if the load feeding condition is met and the above-described "abnormality" has not been detected. Also, the control unit 30 continues the initial state if the load feeding condition is not met and the above-described "abnormality" has not been detected.

If, in step S3, it is determined that the above-described "abnormality" of the first switch 11 has been detected, the control unit 30 starts a second control in step S4. The second control is a control in which the second switch 12 is alternately turned on and off. The second control is specifically a control in which a PWM signal at a set duty cycle is given to the input unit (gate terminal) of the second switch 12, and in the period in which this PWM signal is given, the second switch 12 is turned on during a high-level signal (ON signal) of the PWM signal, and the second switch 12 is turned off during a low-level signal (OFF signal) of the PWM signal.

When performing the second control (on/off control), the control unit 30 may turn the second switch 12 on/off at a predetermined duty cycle, but the following control may also be employed. For example, the power supply control device 1 includes a resistance detection unit that detects the resistance of the first switch 11 when the first switch 11 is in the conductive state. In the example of FIG. 1, the detection circuit 42, the current sensor 44, and the control device 32 correspond to examples of the resistance detection unit. Specifically, based on, for example, a voltage V at both ends of the first switch 11 detected by the detection circuit 42 and a current value I detected by the current sensor 44, an ON-resistance Ron of the first switch 11 can be calculated as an expression Ron=V/I. Note that any other method may also be used as long as it can detect the ON-resistance Ron of the first switch 11. Also, when the second control (on/off control) is started in step S4, the control unit 30 may output a PWM signal, perform on/off control of controlling turning on/off of the second switch 12 using the PWM signal, and set the duty cycle of the PWM signal based on the resistance Ron detected by the resistance detection unit. Specifically, based on, if the resistance Ron is detected by the resistance detection unit, "correspondence information such as a table or an arithmetic expression that determines in advance the correspondence relationship between the ON-resistance and the duty cycle of the PWM signal" (that is, if the ON-resistance is specified, information based on which the duty cycle corresponding to the specified ON-resistance can be determined), the control unit 30 may perform control such that the second switch 12 is turned on/off at the duty cycle specified based on the above-described correspondence information, the duty cycle serving as the duty cycle corresponding to the resistance Ron. Various methods for obtaining the correspondence information can be employed.

The vehicle 190 in which the power supply control device 1 is installed is configured to be switched between a state in which the vehicle can travel and a state in which the vehicle cannot travel. The state in which the vehicle can travel is a state in which for example, an ignition switch is on if the vehicle 190 is a gasoline car or a hybrid automobile. Also, if the vehicle 190 is an electric car, the state in which the vehicle can travel can be understood as a state in which a power switch for activating the vehicle 190 is on. On the other hand, the state in which the vehicle cannot travel is a state in which for example, the ignition switch is off if the vehicle 190 is a gasoline car or a hybrid automobile. Also, if the vehicle 190 is an electric car, the state in which the vehicle cannot travel can be understood as a state in which a power switch for activating the vehicle 190 is off.

In the power supply control device 1, during the on/off control that is performed at least in the state in which the vehicle 190 can travel, the notification unit 60 may notify passengers within the vehicle of an abnormality. The abnormality notification may be lamp display indicating the abnormality of the first switch 11, output of audio giving a notification of the abnormality of the first switch 11, or display or audio output of a message or code giving a notification of the abnormality of the first switch 11.

If, during the second control (on/off control), the vehicle 190 is switched from the state in which the vehicle can travel to the state in which the vehicle cannot travel (for example, the ignition switch of the vehicle 190 is switched from the ON-state to the OFF-state), the control unit 30 continues the on/off control after the switching to the state in which the vehicle cannot travel. Then, when the on/off control is continued after the switching to the state in which the vehicle cannot travel, the control unit 30 controls the third switch 13 to be in the ON state (in which a current can be fed to the load 108 via the third switch 13). Accordingly, if the above-described "abnormality" is detected and the vehicle 190 is switched to the state in which the vehicle cannot travel, it is possible to perform the second control (on/off control) in parallel to power supply to the load 108 based on power from the power source unit 102.

As described above, in the power supply control device 1, if the above-described abnormality is detected by the abnormality detection unit, the control unit 30 performs the on/off control of alternately turning the second switch 12 on and off.

In the power supply control method using the power supply control device 1, the control unit 30 performs the first control of turning the first switch 11 on, and if any abnormality is detected by the abnormality detection unit, the control unit 30 performs the on/off control of alternately turning the second switch 12 on and off.

Then, as shown in FIG. 5, the program for causing the control unit 30 to perform the control shown in FIG. 5 includes a first step (step S1) for causing the control unit 30 to perform the first control of turning the first switch 11 on, and a second step (steps S3 and S4) for causing the control unit 30 to perform the on/off control of alternately turning the second switch 12 on and off if any abnormality is detected by the abnormality detection unit during the first control.

Examples of Effects

The above-described power supply control device 1, power supply method using the power supply control device 1, and program for use in the power supply control device 1 easily realize a situation where, if an abnormality occurs in which a switch remains in a conductive state while an OFF signal is given, a current is promptly suppressed from continuing to flow through the switch. Specifically, the power supply control device 1 can perform the first control of turning the first switch 11 on, so that the current can flow through the first switch 11, which has a relatively small ON-resistance. Also, if an abnormality is detected by the abnormality detection unit, the power supply control device 1 can perform the on/off control of alternately turning the second switch 12 on and off, so that the current flowing between the first conductive path 21 and the second conductive path 22 can be distributed over the first switch 11 and the second switch 12. Accordingly, the effective current of the first switch 11 is suppressed, and heat generation resulting from an increase in damages is suppressed.

When performing the on/off control, the power supply control device 1 can use the notification unit 60 to notify passengers within the vehicle of this fact, and thus the passengers inside the vehicle 190 can recognize and deal with the situation.

The power supply control device 1 can suppress an excessive current from continuing to flow through the first switch 11 in which the abnormality has occurred, after the vehicle has been switched to the state in which the vehicle cannot travel.

If the above-described abnormality is detected, the power supply control device 1 continues the on/off control and supplies power to the load 108 from the power source unit 102 (electric storage unit), which is a power supply source for causing a current to flow through the first switch 11 and the second switch 12, after the vehicle 190 has been switched to the state in which the vehicle cannot travel, thus making it possible to not only suppress the current flowing through the first switch 11, but also reduce the current flow duration by forcibly consuming the power based on the power source unit 102. Note that FIG. 1 shows an example of a configuration in which, after the above-described abnormality has been detected and the vehicle has been switched to the state in which the vehicle cannot travel, discharge of the power source unit 102 can be facilitated by supplying power the load 108, but discharge of the power source unit 102 may be facilitated by a dedicated discharge circuit.

The power supply control device 1 can perform PWM control according to the actual resistance of the first switch 11, when performing the on/off control in response to the above-described abnormality.

In the power supply control device 1, the first switch 11 and the second switch 12 can be arranged on opposite sides at a distance, making it possible to further suppress concentration of heat when the above-described abnormality occurs.

In the power supply control device 1, the first switch 11 and the second switch 12 can be arranged at opposite end portions at a distance, making it possible to further suppress concentration of heat when the above-described abnormality occurs.

OTHER EMBODIMENTS

The present disclosure is not limited to the embodiments described with reference to the specification given above and the drawings. For example, any combination of features of the above-described or later-described embodiments is possible to the extent that they are not inconsistent with each other. Also, any feature of the above-described or later-described embodiments can be omitted as long as it is not explicitly defined as being essential. Furthermore, the above-described embodiments may be modified as follows.

In the above-described embodiment, the first conductive path 21 and the second conductive path 22 are provided inside the power supply control device 1, but a configuration is also possible in which the first conductive path 21 and the second conductive path 22 are provided outside the power supply control device 1.

In the above-described embodiment, the current sensor 44 is provided, but the current sensor 44 does not need to be provided.

In the above-described embodiment, the detection circuit 42 is configured to detect the voltages of both the conductive path 23A and the conductive path 23B, but the detection circuit 42 may be configured to detect only the voltage of the conductive path 23B.

Note that the embodiments disclosed herein are examples in all respects, and should be construed as non-limiting. The scope of the present disclosure is not limited to the embodiments disclosed herein, but is intended to include all modifications within the scope of the claims and equivalent to the scope of the claims.

The invention claimed is:

1. A power supply control device to be installed in a vehicle, comprising:

a first switch that is provided between a first conductive path and a second conductive path, and is configured to be switched on in response to an ON signal and to be switched off in response to an OFF signal;

a second switch provided between the first conductive path and the second conductive path, in parallel to the first switch;

an abnormality detection unit configured to detect an abnormality in which the first switch remains in a conductive state while the OFF signal is given to the first switch; and a control unit configured to control the first switch and the second switch, wherein the first switch has an ON-resistance that is smaller than an ON-resistance of the second switch, and the control unit performs a first control of turning the first switch on, and performs, if the abnormality is detected by the abnormality detection unit, on/off control of alternately turning the second switch on and off.

2. The power supply control device according to claim 1, wherein the vehicle is configured to be switched between a state in which the vehicle can travel and a state in which the vehicle cannot travel, and the power supply control device further comprises a notification unit configured to notify a passenger within the vehicle of an abnormality when the on/off control of the second switch is performed at least while the vehicle is in the state in which the vehicle can travel.

3. The power supply control device according to claim 1, wherein the vehicle is configured to be switched between the state in which the vehicle can travel and the state in which the vehicle cannot travel, and if the vehicle is switched from the state in which the vehicle can travel to the state in which the vehicle cannot travel during the on/off control, the control unit continues the on/off control also after the vehicle has been switched to the state in which the vehicle cannot travel.

4. The power supply control device according to claim 3, wherein, when continuing the on/off control after the vehicle has been switched to the state in which the vehicle cannot travel, the control unit supplies power to a predetermined load from an electric storage unit serving as a power supply source for causing a current to flow through the first switch and the second switch.

5. The power supply control device according to claim 1, further including:

a resistance detection unit configured to detect a resistance of the first switch when the first switch is in the conductive state, and the control unit outputs a PWM signal, performs the on/off control of controlling turning-on/off of the second switch using the PWM signal, and sets a duty cycle of the PWM signal based on the resistance detected by the resistance detection unit.

6. The power supply control device according to claim 1, wherein the first switch and the second switch are mounted on a common substrate, the first switch is mounted on one surface of the substrate, and the second switch is mounted on another surface of the substrate.

7. The power supply control device according to claim 1, wherein the first switch and the second switch are mounted on a common substrate, the first switch is mounted at a position on the substrate near a first end portion on one side in a predetermined direction, and the second switch is mounted at a position on the substrate near a second end portion on a side in the predetermined direction that is opposite to the one side.

8. A power supply control method for controlling power supply inside a vehicle using a power supply control device, the power supply control device comprising:

a first switch that is provided between a first conductive path and a second conductive path, and is configured to be switched on in response to an ON signal and to be switched off in response to an OFF signal;

a second switch provided between the first conductive path and the second conductive path, in parallel to the first switch;

an abnormality detection unit configured to detect an abnormality in which the first switch remains in a conductive state while the OFF signal is given to the first switch; and a control unit configured to control the first switch and the second switch, wherein the first switch has an ON-resistance that is smaller than an ON-resistance of the second switch, and the control unit performs a first control of turning the first switch on, and performs, if the abnormality is detected by the abnormality detection unit, on/off control of alternately turning the second switch on and off.

9. A program for causing a power supply control device installed in a vehicle to execute power supply control, the power supply control device including:

a first switch that is provided between a first conductive path and a second conductive path, and is configured to be switched on in response to an ON signal and to be switched off in response to an OFF signal;

a second switch provided between the first conductive path and the second conductive path, in parallel to the first switch;

an abnormality detection unit configured to detect an abnormality in which the first switch remains in a conductive state while the OFF signal is given to the first switch; and a control unit configured to control the first switch and the second switch, wherein the first switch has an ON-resistance that is smaller than an ON-resistance of the second switch, and the program comprises the steps of:

causing the control unit to execute a first control of turning the first switch on; and causing the control unit to execute, if the abnormality is detected by the abnormality detection unit, on/off control of alternately switching the second switch on and off.

* * * * *